United States Patent
Bchir

(10) Patent No.: US 11,024,617 B2
(45) Date of Patent: Jun. 1, 2021

(54) SEMICONDUCTOR PACKAGES HAVING PHOTON INTEGRATED CIRCUIT (PIC) CHIPS

(71) Applicant: Micron Technology, Inc., Boise, ID (US)

(72) Inventor: Omar J. Bchir, San Marcos, CA (US)

(73) Assignee: Micron Technology, Inc., Boise, ID (US)

( * ) Notice: Subject to any disclaimer, the term of this patent is extended or adjusted under 35 U.S.C. 154(b) by 8 days.

(21) Appl. No.: 16/172,624

(22) Filed: Oct. 26, 2018

(65) Prior Publication Data

US 2020/0132946 A1 Apr. 30, 2020

(51) Int. Cl.
| | |
|---|---|
| *H01L 25/16* | (2006.01) |
| *G02B 6/42* | (2006.01) |
| *G02B 6/122* | (2006.01) |
| *G02B 6/12* | (2006.01) |
| *H01L 23/00* | (2006.01) |
| *H01L 23/52* | (2006.01) |
| *G02B 6/43* | (2006.01) |

(52) U.S. Cl.
CPC ........ *H01L 25/167* (2013.01); *G02B 6/12004* (2013.01); *G02B 6/1225* (2013.01); *G02B 6/421* (2013.01); *G02B 6/4274* (2013.01); *G02B 6/43* (2013.01); *H01L 23/52* (2013.01); *H01L 24/09* (2013.01); *H01L 24/49* (2013.01)

(58) Field of Classification Search
None
See application file for complete search history.

(56) References Cited

U.S. PATENT DOCUMENTS

| | | | |
|---|---|---|---|
| 6,233,376 B1 | 5/2001 | Updegrove | |
| 7,099,585 B2 | 8/2006 | Cordes et al. | |
| 7,254,331 B2 | 8/2007 | Murphy | |
| 7,280,381 B2 | 10/2007 | Lee et al. | |
| 7,289,347 B2 | 10/2007 | Taylor | |
| 7,590,797 B2 | 9/2009 | Janzen | |
| 7,925,168 B2 | 4/2011 | Tan et al. | |
| 8,570,760 B2 | 10/2013 | Chen | |
| 8,971,676 B1 * | 3/2015 | Thacker | G02B 6/12 385/14 |
| 9,054,805 B2 | 6/2015 | Ji et al. | |
| 9,166,705 B2 | 10/2015 | Joe et al. | |

(Continued)

OTHER PUBLICATIONS

Vincent, G. et al., "Complex transmittance gratings based on subwavelength metallic structures", Proceedings of SPIE 6195, Nanophotonics, 61951K (Apr. 20, 2006) (Year: 2006).

(Continued)

*Primary Examiner* — Andres Munoz
(74) *Attorney, Agent, or Firm* — Perkins Coie LLP

(57) ABSTRACT

Memory devices having optical I/O interfaces are described herein. In one embodiment, a memory device includes a plurality of memories coupled to a substrate, each memory including one or more photon integrated (PIC) chips for converting electrical signals to/from optical signals. The memory device can further include a plurality of optical fibers, wherein individual ones of the memories are optically coupled to at least one of the optical fibers. The memories can receive/transmit the optical signals over the optical fibers and can be electrically coupled to a power supply/ground via the substrate.

4 Claims, 7 Drawing Sheets

(56) References Cited

U.S. PATENT DOCUMENTS

| | | | | |
|---|---|---|---|---|
| 9,360,644 B2* | 6/2016 | Fasano | ............... | G02B 6/12004 |
| 9,612,405 B2 | 4/2017 | Aoki et al. | | |
| 10,025,047 B1* | 7/2018 | Liu | ..................... | G02B 6/4243 |
| 10,459,160 B2 | 10/2019 | Brusberg | | |
| 2003/0026141 A1 | 2/2003 | Cordes et al. | | |
| 2009/0020608 A1 | 1/2009 | Bennett et al. | | |
| 2011/0069464 A1 | 3/2011 | Joe et al. | | |
| 2011/0134679 A1 | 6/2011 | Suh et al. | | |
| 2012/0207426 A1* | 8/2012 | Doany | ................... | G02B 6/426 |
| | | | | 385/14 |
| 2013/0230272 A1* | 9/2013 | Raj | ..................... | G02B 6/4246 |
| | | | | 385/14 |
| 2013/0308898 A1* | 11/2013 | Doerr | .................. | G02B 6/4269 |
| | | | | 385/14 |
| 2018/0196196 A1* | 7/2018 | Byrd | .................. | G02B 6/1225 |
| 2018/0217326 A1 | 8/2018 | Brusberg | | |
| 2019/0041576 A1* | 2/2019 | Byrd | ..................... | H04B 10/40 |
| 2019/0044002 A1* | 2/2019 | Byrd | ................ | H01L 31/02019 |
| 2020/0132930 A1 | 4/2020 | Bchir | | |

OTHER PUBLICATIONS

U.S. Appl. No. 16/172,631—Unpublished Patent Application by Omar J. Bchir, titled "Semiconductor Devices Having Electro-Optical Substrates", filed Oct. 26, 2018, 27 pages.

\* cited by examiner

SEMICONDUCTOR PACKAGES HAVING PHOTON INTEGRATED CIRCUIT (PIC) CHIPS

CROSS-REFERENCE TO RELATED APPLICATION

This application contains subject matter related to a concurrently-filed U.S. patent application Ser. No. 16/172,631 by Omar J. Bchir, titled "SEMICONDUCTOR DEVICES HAVING ELECTRO-OPTICAL SUBSTRATES." The related application, of which the disclosure is incorporated by reference herein, is assigned to Micron Technology, Inc.

TECHNICAL FIELD

The present disclosure generally relates to semiconductor packages having optical interfaces, and more particularly relates to memory packages including photon integrated circuit (PIC) chips electrically coupled to one or more memory dies.

BACKGROUND

Memory packages or modules typically include multiple memory devices mounted on a substrate. Memory devices are widely used to store information related to various electronic devices such as computers, wireless communication devices, cameras, digital displays, and the like. Information is stored by programing different states of a memory cell. Various types of memory devices exist, including magnetic hard disks, random access memory (RAM), read only memory (ROM), dynamic RAM (DRAM), synchronous dynamic RAM (SDRAM), and others.

In some instances, such as in data centers or high-performance computers, many memory packages are operatively coupled together (e.g., in server racks). More specifically, individual memory packages can be electrically coupled together via conductive (e.g., copper) cables or traces. In some instances, the electrically conductive cables or traces are further coupled to optical transceivers that convert electrical signals into optical signals that can be routed at high speeds and bandwidths, for example, between different locations in a data center. Such optical transceivers can be relatively expensive. Moreover, at high data bandwidths the electrical signals in the conductive cables or traces can only propagate for small distances (e.g., less than 1 meter) until additional repeater chips are needed to boost the signals. Such repeater chips consume additional power—increasing the cost of operating a data center, high-performance computer, or other device including many interconnected memory packages.

BRIEF DESCRIPTION OF THE DRAWINGS

Many aspects of the present technology can be better understood with reference to the following drawings. The components in the drawings are not necessarily to scale. Instead, emphasis is placed on illustrating clearly the principles of the present technology.

DETAILED DESCRIPTION

Figure 1A:
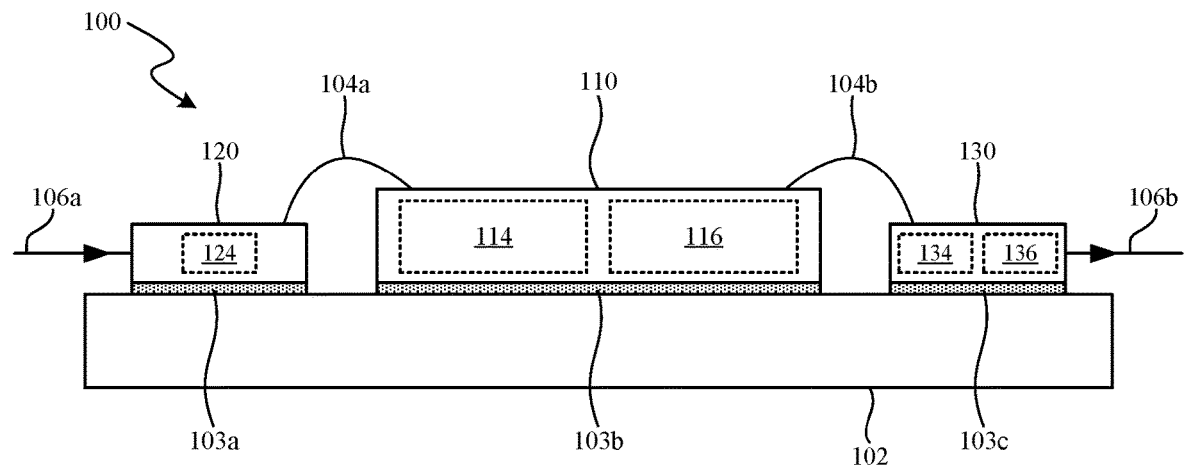
FIGS. 1A and 1B are partially schematic side cross-sectional and top views, respectively, of a semiconductor device or package configured in accordance with an embodiment of the present technology.

Specific details of several embodiments of semiconductor package including photon integrated circuit (PIC) chips, and associated systems and methods, are described below with reference to FIGS. 1-6. In several of the embodiments, a semiconductor package is a memory package having a substrate and at least one memory die coupled to the substrate. A first PIC chip is mounted on the substrate and electrically coupled to the memory die. At least one first optical fiber is optically coupled to the first PIC chip and configured to receive first optical signals from external circuitry and/or devices. The first PIC chip converts the first optical signals into first electrical signals and transmits the first electrical signals to the memory die. The memory package further includes a light source electrically coupled to the memory die and a second PIC chip mounted on the substrate and optically coupled to the light source. The memory die includes driver circuitry for generating second electrical signals that drive the light source to modulate (e.g., generate) second optical signals for transmission to the second PIC chip and from the memory package to external circuitry via at least one second optical fiber.

Accordingly, embodiments of the present technology advantageously integrate PIC chips and memory dies into the same package to provide the package with an optical in/out (I/O) interface. That is, the disclosed memory packages can convert electrical I/O data signals from electrically-based memory dies to optical I/O data signals at the package level. In contrast, many conventional memory systems route electrical signals from memory packages to electro-optical transceivers that are positioned external to the memory packages (e.g., at the box or rack level in a data center). Thus, the present technology can reduce or eliminate the need for such electro-optical transceivers in the data path—reducing costs, complexity, and/or power consumption. Moreover, by reducing the amount of conductive metal (e.g., copper wires, traces, etc.) in the data path, the present technology can reduce the need for repeater chips or other components for boosting signal strength and/or integrity during data transmission at high bandwidths—further reducing costs, complexity, and/or power consumption.

Numerous specific details are discussed to provide a thorough and enabling description of embodiments of the present technology. A person skilled in the art, however, will understand that the technology may have additional embodiments and that the technology may be practiced without several of the details of the embodiments described below with reference to FIGS. 1-6. In other instances, well-known structures or operations often associated with memory devices are not shown, or are not described in detail, to avoid obscuring other aspects of the technology. In general, it should be understood that various other devices and systems in addition to those specific embodiments disclosed herein may be within the scope of the present technology. For example, in the many of the embodiments below, the memory devices and systems are described in the context of DRAM and flash (e.g., NAND and/or NOR) storage media, and DIMMs compatible with DRAM and flash storage media. Memory devices and systems configured in accordance with other embodiments of the present technology, however, can include memory modules compatible with other types of storage media, including PCM, RRAM, MRAM, read only memory (ROM), erasable programmable ROM (EPROM), electrically erasable programmable ROM (EEROM), ferroelectric, magnetoresistive, and other storage media, including static random-access memory (SRAM). Additionally, the present technology can be used in semiconductor devices other than memory devices.

As used herein, the terms "vertical," "lateral," "upper," "lower," "above," and "below" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

Unless the context indicates otherwise, structures disclosed herein can be formed using conventional semiconductor-manufacturing techniques, and stages of the methods used to form the structures can be performed at the wafer level or at the die level. Materials can be deposited, for example, using chemical vapor deposition, physical vapor deposition, atomic layer deposition, spin coating, and/or other suitable techniques. Similarly, materials can be removed, for example, using plasma etching, wet etching, chemical-mechanical planarization, or other suitable techniques.

Figure 1B:
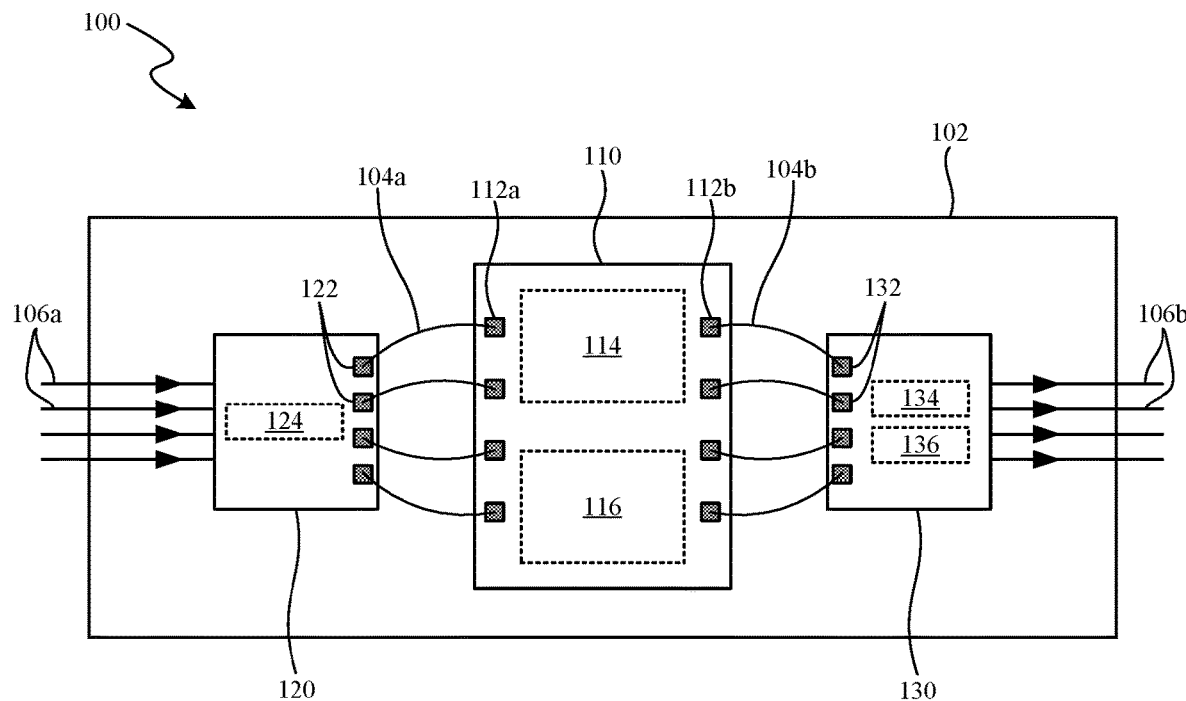

FIGS. 1A and 1B are partially schematic side cross-sectional and top views, respectively, of a semiconductor device or package 100 ("package 100") configured in accordance with an embodiment of the present technology. Referring to FIGS. 1A and 1B together, the package 100 includes a semiconductor die 110, a first photon integrated circuit (PIC) chip 120, and a second PIC chip 130 each coupled to (e.g., carried by, mounted on, etc.) a package substrate 102. The package substrate 102 can include an interposer, a printed circuit board, a dielectric spacer, another semiconductor die (e.g., a logic die), or another suitable substrate. In some embodiments, the semiconductor die 110 and the first and second PIC chips 120, 130 can be coupled to the package substrate 102 via first through third die-attach materials 103a-103c, respectively. In some embodiments, the semiconductor die 110 and/or the PIC chips 120, 130 can be electrically coupled to the substrate via wirebonds (not shown in FIGS. 1A and 1B), conductive interconnects (e.g., in a flip-chip arrangement), or other suitable structures known in the art. In certain embodiments, the semiconductor die 110 and/or the PIC chips 120, 130 are electrically coupled to the package substrate 102 for receiving power via the package substrate 102. As described in greater detail below, in-out (I/O) data communication to the semiconductor die 110 can be provided via a separate electro-optical path that is independent of any electrical connection to the package substrate 102. Moreover, while the semiconductor die 110 is shown positioned laterally between the PIC chips 120, 130 in FIGS. 1A and 1B, in other embodiments, the semiconductor die 110 and the PIC chips 120, 130 can be positioned differently on the package substrate 102. For example, the PIC chips 120, 130 can be positioned adjacent to the same side of the semiconductor die 110, the PIC chips 120, 130 can be positioned adjacent to orthogonal sides of the semiconductor die 110, etc.

In the illustrated embodiment, the semiconductor die 110 includes first bond pads 112a and second bond pads 112b arranged on opposing sides of the semiconductor die 110. The first PIC chip 120 includes bond pads 122 and the second PIC chip 130 includes bond pads 132. The semiconductor die 110 is electrically coupled to (i) the first PIC chip 120 via first wirebonds 104a extending between and electrically connecting the bond pads 122 of the first PIC chip 120 and the first bond pads 112a of the semiconductor die 110, and (ii) the second PIC chip 130 via second wirebonds 104b extending between and electrically connecting the bond pads 132 of the second PIC chip 130 and the second bond pads 112b of the semiconductor die 110. In other embodiments, the bond pads 112a, 112b, 122, and/or 132 can have different configurations, shapes, placements, etc., and/or the semiconductor die 110 can be electrically coupled to the PIC chips 120, 130 via other suitable methods. In some embodiments, for example, the semiconductor die 110 can be electrically coupled to the PIC chips 120, 130 via the package substrate 102 (e.g., via conductive traces in and/or on the package substrate 102), via direct-chip attach methods (e.g., via conductive pillars, studs, etc., in a stacked arrangement), etc.

Figure 3:
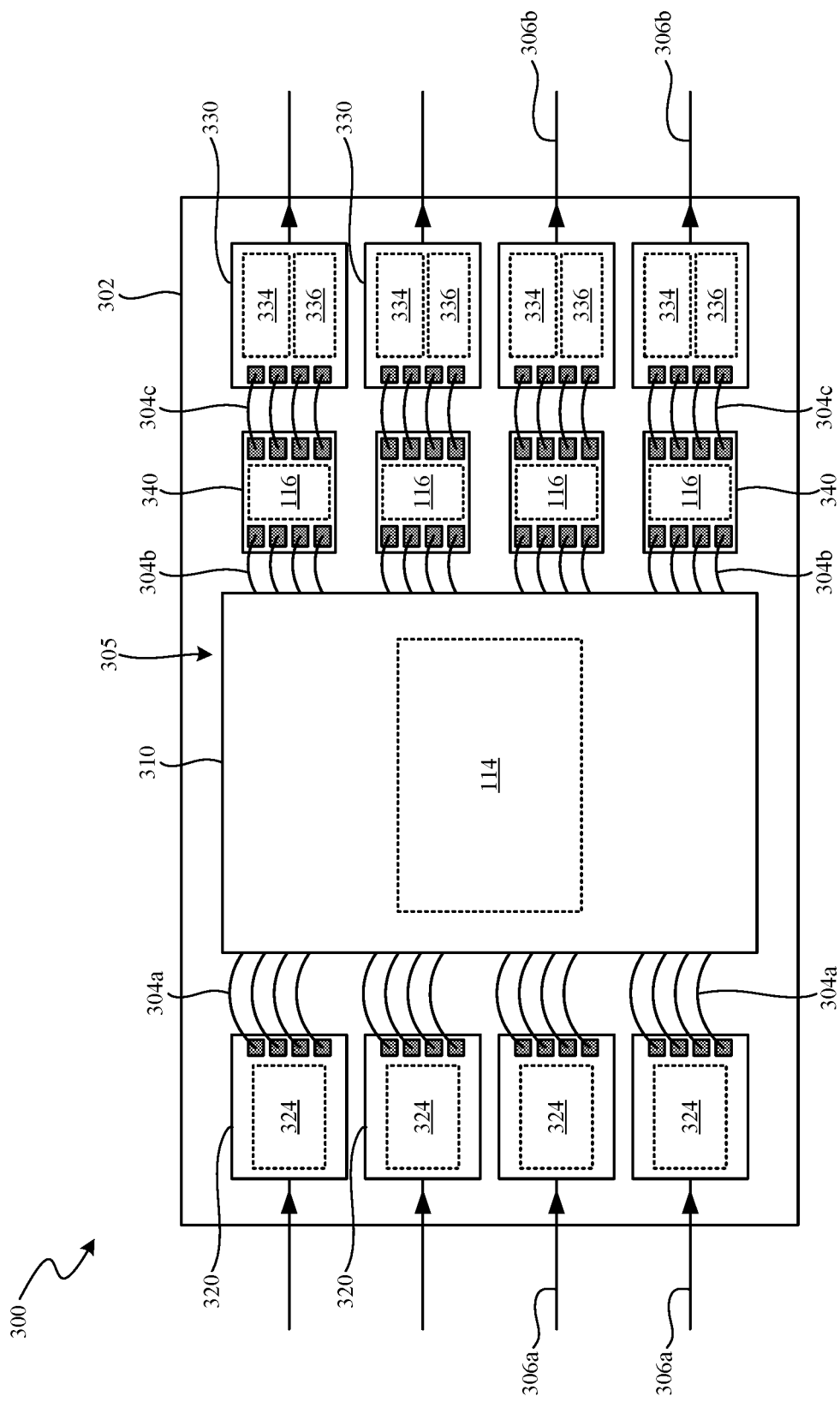
FIG. 3 is a partially schematic top view of a semiconductor device or package configured in accordance with another embodiment of the present technology.

The semiconductor die 110 includes integrated circuitry 114 (shown schematically) such as, for example, integrated memory circuitry and/or logic circuitry, which can include various types of semiconductor components and functional features, such as dynamic random-access memory (DRAM), static random-access memory (SRAM), flash memory, other forms of integrated circuit memory, processing circuits, and/or other semiconductor features. In the illustrated embodiment, the semiconductor die 110 further includes analog driver circuitry 116 (shown schematically) for converting digital signals within the semiconductor die 110 to analog signals, as described in greater detail below. In some embodiments, the analog driver circuitry 116 can be provided on a separate semiconductor die from the integrated circuitry 114 (e.g., as illustrated in FIG. 3).

The first PIC chip 120 includes integrated circuitry 124 (shown schematically) and the second PIC chip 130 includes integrated circuitry 134 (shown schematically) that can be formed on and/or in a substrate (e.g., a silicon substrate, indium phosphide (InP) substrate, electro-optic crystal-based substrate, etc.). In general, the integrated circuitry 124, 134 includes photon integrated circuitry that can incorporate multiple photonic functions and/or devices such as, for example, wavelength-division multiplexers (WDM), arrayed waveguide gratings (AWG), optical filters, optical amplifiers, optical modulators, photodiodes, light sources (e.g., lasers), optical detectors, etc. The second PIC chip further includes a light source 136—such as a laser—that can be externally driven to modulate light generated by the light source 136. In some embodiments, the light source 136 can be formed as part of the integrated circuitry 134 or otherwise on and/or in the second PIC chip 130 while, in other embodiments, the light source 136 can be a separate chip or component that is (i) electrically coupled to the semiconductor die 110 directly (e.g., via the second wirebonds 104b) and/or indirectly (e.g., via an electrical connection to the second PIC chip 130), and (ii) optically coupled to the second PIC chip 130. In some embodiments, for example, the light source 136 can be a separate chip or component that is soldered to the second PIC chip 130.

In the illustrated embodiment, an array of first optical fibers 106a are optically coupled to the first PIC chip 120, and an array of second optical fibers 106b are optically coupled to the second PIC chip 130. The optical fibers 106a, b are configured to optically couple the PIC chips 120, 130 to external devices, systems, etc., such as other semiconductor devices in a data center. The optical fibers 106a, b can be optically coupled to the PIC chips 120, 130 through an edge connection, a butt connection, or another suitable connection known in the art. For example, in an edge connection configuration, the substrates of the PIC chips 120, 130 can be etched to include gutters or grooves (e.g., v-grooves), and the optical fibers 106a, b can be positioned within the grooves such that the optical fibers 106a, b are optically coupled to the integrated circuitry 124, 134 (e.g., aligned with waveguides of the integrated circuitry 124, 134). In some embodiments, an optically transparent epoxy and/or a refractive index matching gel can be used to close any gaps between the optical fibers 106a, b and the PIC chips 120, 130. In a butt connection configuration, the optical fibers 106a, b can be positioned generally perpendicular to the PIC chips 120, 130 and optically coupled to the integrated circuitry 124, 134 via optical gratings (e.g., vertical grating couplings). While four first optical fibers 106a and four second optical fibers 106b are shown in FIG. 1B, the package 100 can include any number of optical fibers. For example, the integrated circuitry 124 of the first PIC chip 120 and/or the integrated circuitry 134 of the second PIC chip 130 can include optical (de)multiplexers such that a single first optical fiber 106a and/or a single second optical fiber 106b can be used to transmit/receive optical signals from the PIC chips 120, 130 (e.g., as shown FIG. 3). Likewise, the package 100 can include more than four optical fibers 106a, b (e.g., where the semiconductor die 110 has a higher bandwidth) and/or the package 100 can include multiple ones of the PIC chips 120, 130.

In operation, the first PIC chip 120 and the first optical fibers 106a comprise a receive side or receive function of the package 100. Specifically, the first PIC chip 120 is configured to (i) receive optical signals (e.g., data signals) from a source that is external to the package 100 (e.g., a device in a data center that is external to the package 100) over the first optical fibers 106a, (ii) convert the optical signals into electrical signals (e.g., via the integrated circuitry 124 of the first PIC chip 120), and (iii) transmit the electrical signals to the semiconductor die 110 (e.g., via the first wirebonds 104a). Conversely, the second PIC chip 130 and the second optical fibers 106b comprise a transmit side or transmit function of the package 100. Specifically, the analog driver circuitry 116 of the semiconductor die 110 is configured to convert digital electrical signals within the semiconductor die 110 to analog electrical signals and transmit the analog signals to the second PIC chip 130 (e.g., via the second wirebonds 104b). The analog electrical signals drive the light source 136 to produce optical signals (e.g., data signals) that can be transmitted from the package 100 over the second optical fibers 106b. Put differently, the analog driver circuitry 116 of the semiconductor die 110 operates to modulate light produced by the light source 136 of the second PIC chip 130.

Accordingly, the package 100 is configured to both receive and transmit optical signals. In contrast, many conventional semiconductor packages are configured to receive and transmit electrical signals (e.g., via package contacts that provide an electrical connection to external devices). Incorporating such conventional semiconductor packages into an optical I/O system—such as a data center including optical switches and server packages or some high-performance computer—requires connecting electro-optical transceivers to the semiconductor packages via electrically conductive lines such as copper wires or traces. Such electro-optical transceivers require additional power to operate, and can be relatively expensive. Likewise, at high data bandwidths (e.g., about 28 Gbps or greater), the electrical signals from the semiconductor packages can degrade over short transmission distances (e.g., less than about 1 meter) along the conductive lines. Therefore, repeater chips and/or other signal-amplifying or boosting components must be added to the signal path to preserve the integrity of the electrical signals. Again, such components can be expensive and increase power consumption. The present technology therefore reduces costs, complexity, and power consumption compared to conventional systems by converting electrical signals to optical signals at the package level.

In some embodiments, all I/O data signals to the semiconductor die 110 are provided via the PIC chips 120, 130 rather than, for example, from an electrical source coupled to the package substrate 102. However, in other embodiments, the package 100 can include only the first PIC chip 120 and/or the second PIC chip 130 such that the package 100 is configured to (i) receive optical signals (e.g., via the first PIC chip 120) and transmit electrical signals or (ii) receive electrical signals and transmit optical signals (e.g., via the second PIC chip 130). Moreover, in some embodiments, the package 100 can further include other structures or features such as, for example: (i) a casing such as a thermally conductive casing that encloses the semiconductor die 110, the PIC chips 120, 130, the wirebonds 104a, b, and/or the optical fibers 106a, b within an enclosure, and/or (ii) an encapsulant deposited or otherwise formed around, over, and/or between the semiconductor die 110, the PIC chips 120, 130, the wirebonds 104a, b, and/or the optical fibers 106a, b.

Figure 2:
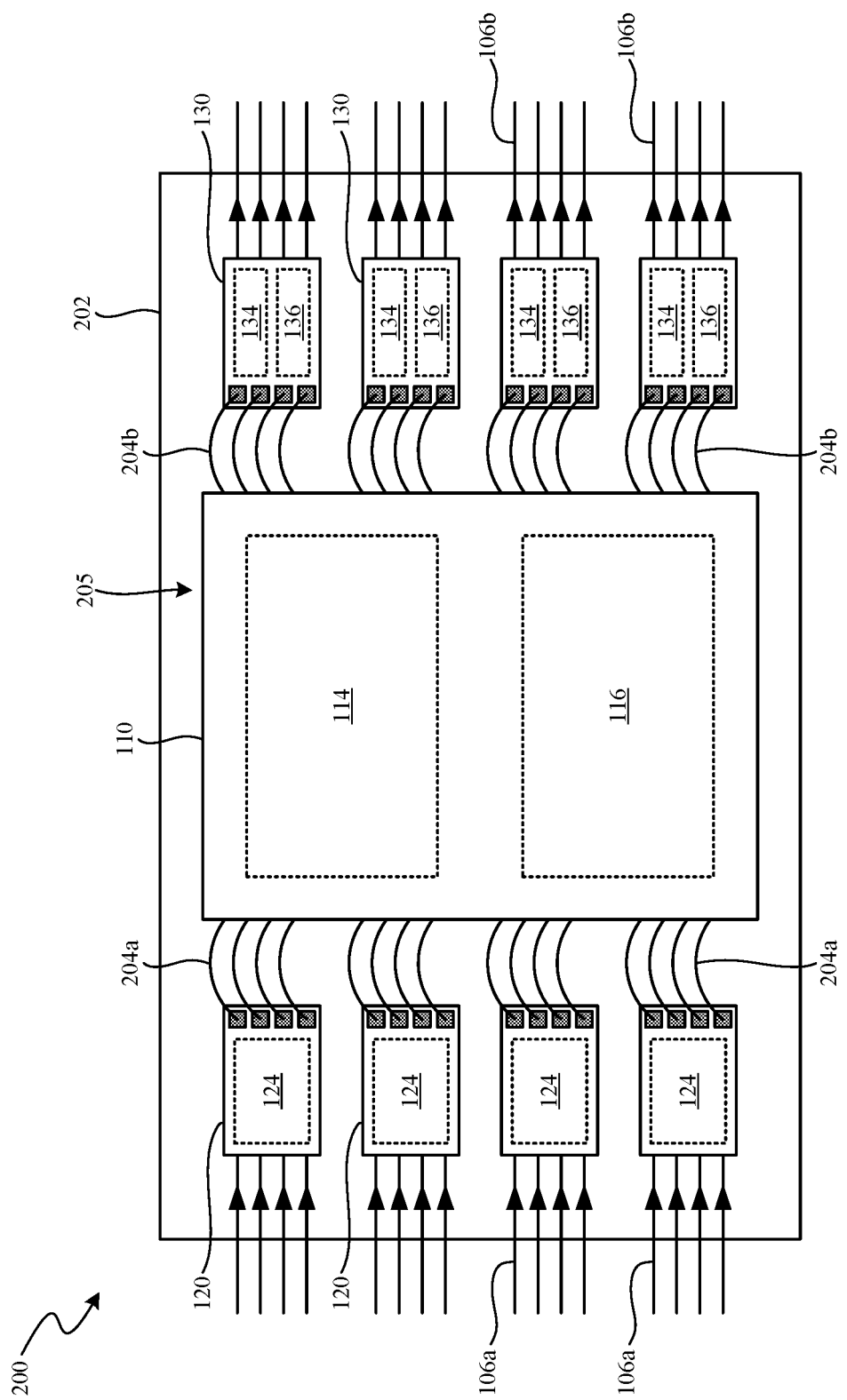
FIG. 2 is a partially schematic top view of a semiconductor device or package configured in accordance with another embodiment of the present technology.

FIG. 2 is a partially schematic top view of a semiconductor device or package 200 ("package 200") configured in accordance with another embodiment of the present technology. The package 200 can include features generally similar to the features of the package 100 described in detail above. In the illustrated embodiment, however, the package 200 includes a stack 205 of the semiconductor dies 110 carried by a package substrate 202. A plurality of the first PIC chips 120 are coupled to the package substrate 202 and electrically coupled to at least one of the semiconductor dies 110 in the stack 205 via first wirebonds 204a. Likewise, a plurality of the second PIC chips 130 are coupled to the package substrate 202 and electrically coupled to at least one of the semiconductor dies 110 in the stack 205 via second wirebonds 204b.

In some embodiments, one of the first PIC chips 120 and one of the second PIC chips 130 can be coupled to each of the semiconductor dies 110 in the stack 205 (e.g., the number of semiconductor dies 110, first PIC chips 120, and second PIC chips 130 can be the same). In the illustrated embodiment, for example, the stack 205 can include four semiconductor dies 110 each coupled to a single one of the first PIC chips 120 and a single one of the second PIC chips 130. In other embodiments, more than one of the first PIC chips 120 and/or more than one of the second PIC chips 130 can be coupled to individual ones of the semiconductor dies 110 (e.g., the number of first PIC chips 120 and/or the number of second PIC chips 130 can be greater than the number of semiconductor dies 110), or individual ones of the PIC chips 120, 130 can be coupled to more than one of the semiconductor dies 110 (e.g., the number of semiconductor dies 110 can be greater than the number of first PIC chips 120 and/or the number of second PIC chips 130).

In operation, the package 200 is configured to receive/transmit optical signals as described in detail above with reference to FIGS. 1A and 1B. For example, the first PIC chips 120 can (i) receive first optical signals from an external source via an array of the first optical fibers 106a, (ii) convert the first optical signals to electrical signals (e.g., via the integrated circuitry 124 of the individual first PIC chips 120), and (iii) transmit the electrical signals to respective ones of the semiconductor dies 110 in the stack 205 (e.g., via the first wirebonds 204a). Similarly, the analog driver circuitry 116 of the semiconductor dies 110 operates to convert digital signals from the integrated circuitry 114 of the semiconductor dies 110 to analog electrical signals and transmit the analog electrical signals to respective ones of the second PIC chips 130 (e.g., via the second wirebonds 204b). The analog electrical signals drive the light sources 136 of the second PIC chips 130 to modulate light signals for transmission from the package 200 via an array of the second optical fibers 106b.

One of skill in the art will understand that the various functionalities, components, and/or devices of the embodiments illustrated in FIGS. 1A-2 can be combined and/or separated without deviating from the scope of the present technology. FIG. 3, for example, is a partially schematic top view of a semiconductor device or package 300 ("package 300") configured in accordance with another embodiment of the present technology. The package 300 can include features generally similar to the features of the semiconductor packages 100 and 200 described in detail above. For example, the package 300 includes (i) a plurality of first semiconductor dies 310 arranged in a stack 305 on a package substrate 302, (ii) a plurality of first PIC chips 320 coupled to the package substrate 302 and electrically coupled to at least one of the first semiconductor dies 310 in the stack 305 via first wirebonds 304a, and (iii) a plurality of second PIC chips 330 coupled to the package substrate 302. Similarly, first optical fibers 306a are optically coupled to the first PIC chips 320 and second optical fibers 306b are optically coupled to the second PIC chips 330.

In the illustrated embodiment, individual ones of the first semiconductor dies 310 can include the integrated circuitry 114. However, the package 300 further includes a plurality of second semiconductor dies 340 each including the analog driver circuitry 116. That is, compared to the embodiments illustrated in FIGS. 1A-2, the analog driver circuitry 116 is separated from the semiconductor die(s) having the integrated circuitry 114. As further shown in the illustrated embodiment, the second semiconductor dies 340 are electrically coupled to (a) corresponding ones of the first semiconductor dies 310 via second wire bonds 304b and (b) corresponding ones of the second PIC chips 330 via third wirebonds 304c. In other embodiments, the second semiconductor dies 340 can be electrically coupled to the first semiconductor dies 310 and/or the second PIC chips 330 via the package substrate 302 (e.g., via conductive traces or lines in the package substrate 302), and/or the second semiconductor dies 340 can be stacked on either the first semiconductor dies 310 or the second PIC chips 330 and directly attached via solder balls or other interconnect structures. In some embodiments, by locating the analog driver circuitry 116 and the integrated circuitry 114 on separate semiconductor dies, the first semiconductor dies 310 can be fabricated to have relatively smaller dimensions (e.g., compared to the semiconductor dies 110) and/or the first semiconductor dies 310 can be standard semiconductor dies well known in the art (e.g., conventional DRAM memory dies).

The first PIC chips 320 can have integrated circuitry 324, and the second PIC chips 330 can have integrated circuitry 334 and a light source 336 that are generally similar to the integrated circuitry 124, 134 and the light source 136, respectively, described in the detail above with reference to FIGS. 1A-2. In the embodiment illustrated in FIG. 3, however, the integrated circuitry 324 includes a demultiplexer (e.g., a coarse wavelength division demultiplexer) such that optical signals from an external source can be received over only a single one of the optical fibers 306a. Similarly, the integrated circuitry 334 of the second PIC chips 330 includes a multiplexer (e.g., a coarse wavelength division multiplexer) such that optical signals generated by the light sources 336 can be transmitted over only a single one of the optical fibers 306b. In other embodiments, multiple multiplexed-signal-carrying optical fibers can be coupled to the PIC chips 320, 330.

Figure 4:
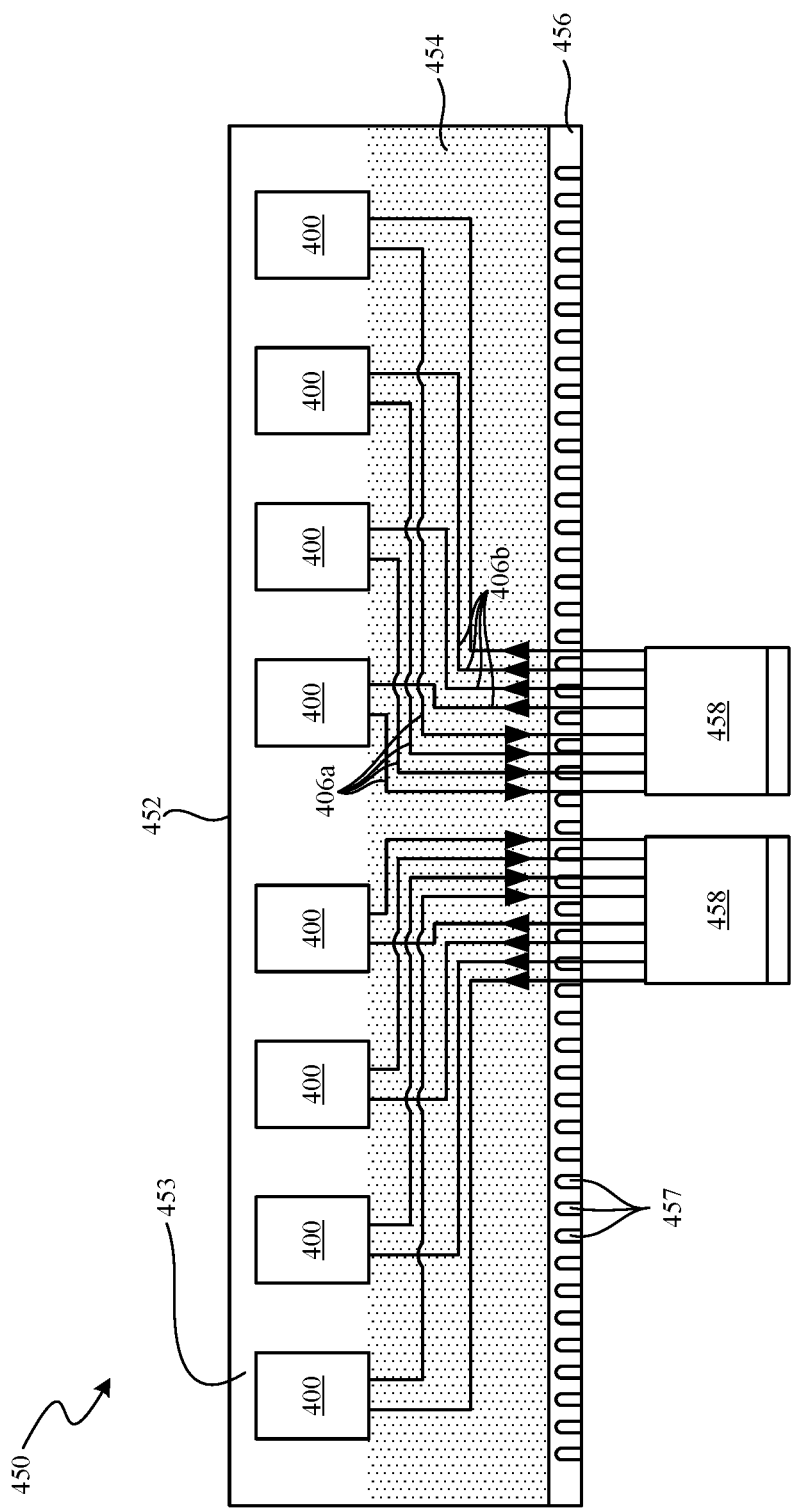
FIG. 4 is a front view of a memory device configured in accordance with an embodiment of the present technology.

In some embodiments, multiple semiconductor packages configured in accordance with the present technology can be incorporated into a larger semiconductor device (e.g., a memory device) to enable optical I/O data transmission to the semiconductor device. FIG. 4, for example, is a front view of a memory device 450 configured in accordance with an embodiment of the present technology. In the illustrated embodiment, the memory device 450 can be a memory module, such as a dual in-line memory module (DIMM) including a substrate (e.g., a printed circuit board (PCB) or the like) 452. A plurality of memories 400 can be coupled to the package substrate 452 via, for example, electrical connectors (e.g., solder balls). The memories 400 can be generally similar to the semiconductor packages 100, 200, and/or 300 described in detail above with reference to FIGS. 1A-3. In particular, the memories 400 can include one or more semiconductor dies (e.g., the semiconductor dies 110) each including integrated circuitry (e.g., the integrated circuitry 114) and/or driver circuitry (e.g., the analog driver circuitry 116), and one or more PIC chips (e.g., the PIC chips 120, 130) electrically coupled to the semiconductor dies and configured to (i) transmit and/or receive optical signals to/from the memories 400 and (ii) transmit and/or receive electrical signals to/from the semiconductor dies. In some embodiments, the memories 400 can be DRAM memories (e.g., DRAM memory dies, DRAM memory chips, DRAM memory packages, or the like). In some embodiments, the memories 400 can be identical (e.g., DRAM memory packages manufactured to have the same design and specifications), while in other embodiments the memories 400 can be different from each other (e.g., including different types of memory dies or different combinations of controller, logic, and/or memory dies).

In the illustrated embodiment, the memories 400 are arranged in a row on a first side or surface 453 of the package substrate 452. In other embodiments, the memories 400 can be arranged differently and/or can comprise a different number. For example, more or fewer than the illustrated eight memories 400 (e.g., four, ten, sixteen, twenty, etc.) can be arranged in any number of rows and/or columns, can be generally unaligned, etc. In some embodiments, the same or a different number of the memories 400 can be arranged on a second surface (not shown) of the package substrate 452 that is opposite the first surface 453. Any of the memories 400 on the second surface of the package substrate 452 can have the same or a generally similar configuration as the memories 400 on the first surface 453 of the package substrate 452. In some embodiments, the memory device 450 can include other electrical components (e.g., semiconductor components, integrated circuit components, etc.) coupled to the package substrate 452. For example, the memory device 450 can include one or more voltage regulators or power management integrated circuits (PMICs) and/or one or more registering clock drivers (RCDs) coupled to the package substrate 452.

In the illustrated embodiment, a single first (e.g., receive) optical fiber 406a and a single second (e.g., transmit) optical fiber 406b are optically coupled to individual ones of the memories 400. In some embodiments, each optical fiber 406a, b can carry a multiplexed optical signal. In other embodiments, as set forth in detail above, multiple ones of the first optical fibers 406a and/or multiple ones of second optical fibers 406b can be optically coupled to individual ones of the memories 400. For example, the number of optical fibers 406a, b can vary depending on the bandwidth of the memories 400, whether the PIC chips of the memories 400 are configured to (de)multiplex optical signals from/to the memories 400, the number of semiconductor dies in the memories 400, etc. In general, the optical fibers 406a, b are configured to optically couple the memories 400 to external devices, circuitry, etc. In the illustrated embodiment, the optical fibers 406a, b are coupled to optical connectors 458 that facilitate easy coupling of the optical fibers 406a, b to external devices. In some embodiments, for example, the optical connectors 458 can be multi-fiber push on (MPO) connectors or other suitable connectors. While two optical connectors 458 are illustrated in FIG. 4, any number of optical connectors 458 can be used to bundle the optical fibers 406a, b. In other embodiments, the optical connectors 458 can be omitted, and the optical fibers 406a, b can be routed individually from the memory device 450 and optically coupled to external devices via other suitable methods.

As further shown in FIG. 4, the optical fibers 406a, b can be bundled and routed along the first surface 453 of the package substrate 452 to the optical connectors 458. In some embodiments, an epoxy 454 (e.g., an epoxy glue) or other encapsulant can be deposited over all or a portion of the first surface 453 and the optical fibers 406a, b (e.g., via a glob top method) to protect the optical fibers 406a, b from damage and/or to inhibit tangling, knotting, etc., of the optical fibers 406a, b. In the illustrated embodiment, the epoxy 454 does not encapsulate (e.g., does not cover or surround) the memories 400 while, in other embodiments, the epoxy 454 can encapsulate the memories 400 and/or cover the entire first surface 453 of the package substrate 452.

The memory device 450 further includes an edge connector 456 along a lower edge of the package substrate 452. The edge connector 456 includes a plurality of contacts 457 for connecting the memories 400 to external circuitry (not shown). In some embodiments, for example, the edge connector 456 can be used to releasably secure the memory device 450 in a corresponding DIMM slot in a host device (e.g., a motherboard). More particularly, in some embodiments, the edge connector 456 can electrically couple the memories 400 to an external power/ground source. However, the edge connector 456 need not connect the memories 400 to the host device for I/O transmission of data signals (e.g., during memory access operations), as the I/O transmission of data signals can be carried out optically via transmission over the optical fibers 406a, b, as described in detail above. In some embodiments, data transmission to/from the memories 400 is carried out only over the optical fibers 406a, b—and not over the package substrate 452. Put differently, in some embodiments, the package substrate 452 can only electrically couple the memories 400 to power/ground.

Figure 5A:
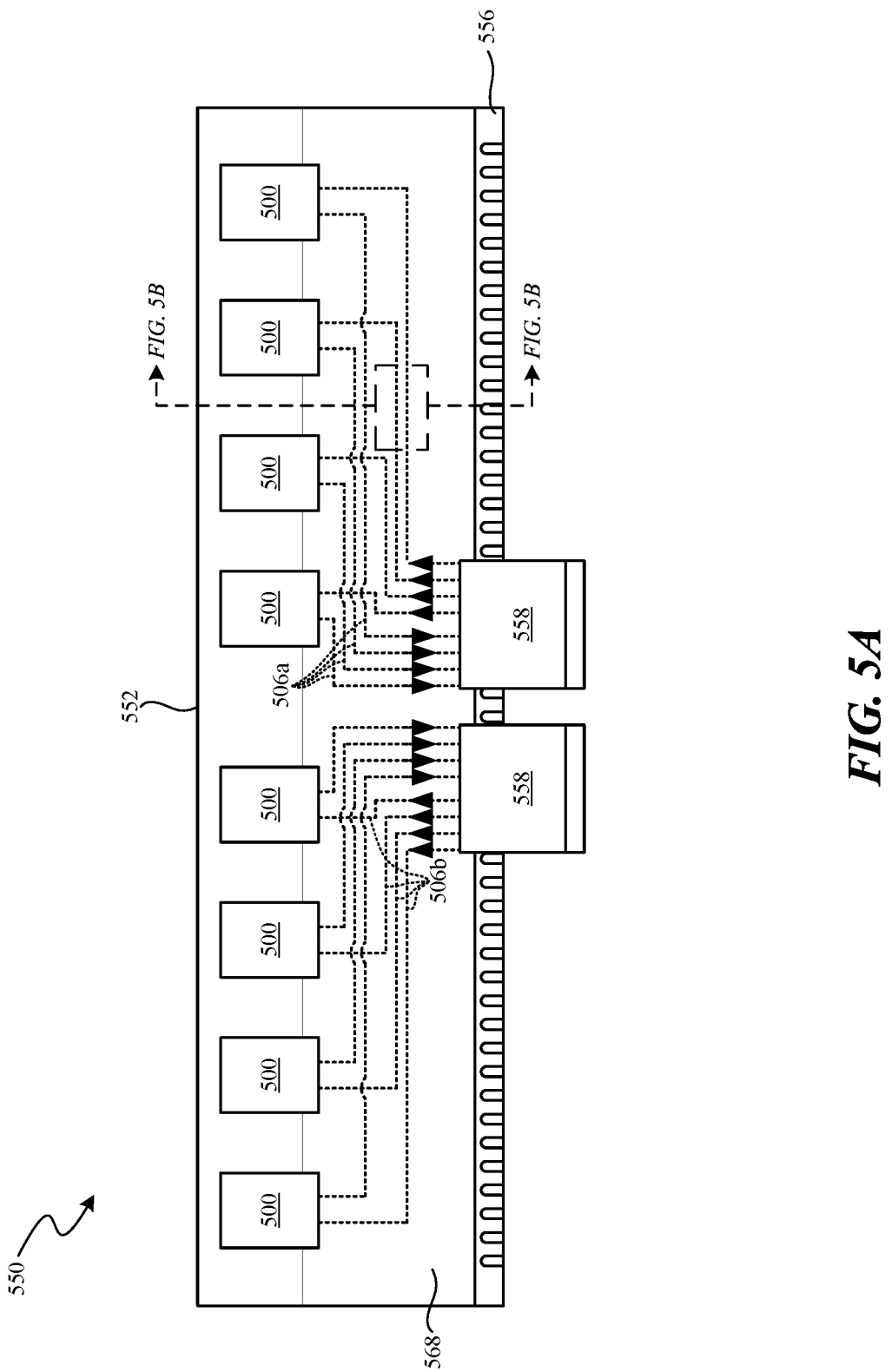
FIG. 5A is a partially schematic front view of a memory device configured in accordance with another embodiment of the present technology and having an electro-optical substrate.

In some embodiments, a memory device according to the present technology can include an integrated waveguide that can reduce or eliminate the need for discrete optical fibers (e.g., the optical fibers 406a, b). FIG. 5A, for example, is a partially schematic front view of a memory device 550 configured in accordance with another embodiment of the present technology and having an electro-optical substrate 552. The memory device 550 can include features generally similar to the features of the memory device 450 described in detail above with reference to FIG. 4. For example, the memory device 550 includes a plurality of memories 500 coupled to the electro-optical substrate 552, and an edge connector 556.

Figure 5B:
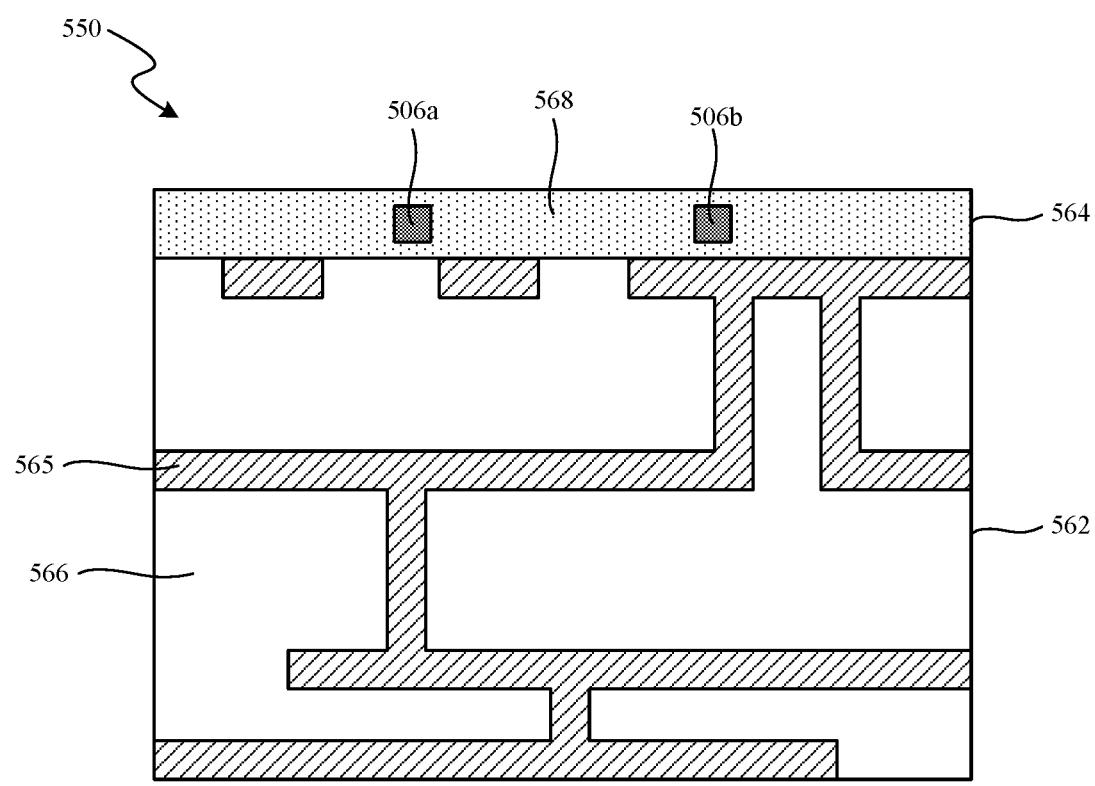
FIG. 5B is a cross-sectional view of a portion of the electro-optical substrate shown in FIG. 5A.

FIG. 5B is a side cross-sectional view of a portion of the electro-optical substrate 552 shown in FIG. 5A. Referring to FIG. 5B, the electro-optical substrate includes an electrical substrate (e.g., a PCB or the like) 562 and an optical layer (e.g., an optical routing layer) 564 on the electrical substrate 562. The electrical substrate 562 can include one or multiple layers of conductive material 565 (e.g., conductive traces, vias, etc.) and dielectric material 566 as is known in the art. The optical layer 564 can comprise a waveguide (e.g., a polymer waveguide) formed from one or more layers of optical material (e.g., silicon materials or compounds, polymers, dielectric materials, etc.). For example, referring to FIGS. 5A and 5B together, the optical layer 564 can include (i) first (e.g., receive) core portions 506a, (ii) second (e.g., transmit) core portions 506b, and (iii) a cladding portion 568. The core portions 506a, b are shown schematically in FIG. 5A for the sake of clarity. In some embodiments, the cladding portion 568 can be formed from one or more materials having a lower refractive index than material(s) used to form the core portions 506a, b such that light signals transmitted through the optical layer 564 are substantially confined to the core portions 506a, b. In the illustrated embodiment, the core portions 506a, b each have a generally rectilinear cross-sectional shape while, in other embodiments, the core portions 506a, b can have other cross-sectional shapes (e.g., circular, polygonal, irregular, v-shaped, etc.).

In some embodiments, the optical layer 564 can be fabricated by photolithographic, laser direct writing, UV-laser direct imaging, nano-imprint lithographic, mosquito (e.g., needle-type liquid microdispensing), and/or other suitable deposition and patterning methods known in the art. In some embodiments, the optical layer 564 can be formed directly on the electrical substrate 562—for example, by depositing the one or more layers of optical material directly onto the electrical substrate 562 and processing the optical material via UV-laser direct imaging or another suitable process. In some such embodiments, the optical layer 562 is additively built or formed on the electrical substrate 562 such that the optical layer does not include any other substrate (e.g., a pre-formed substrate). In other embodiments, the optical layer 564 can be a separate structure that is formed on a separate substrate—such as, for example, a flexible substrate (e.g., a sheet or reel of plastic film) or a rigid substrate (e.g., glass or silicon)—and glued or otherwise affixed to the electrical substrate 562.

The memories 500 are (i) optically coupled to the core portions 506a, b of the optical layer 564 and (ii) electrically coupled to the conductive material 565 of the electrical substrate 562. In the illustrated embodiment, optical connectors 558 are also optically coupled to the core portions 506a, b of the optical layer 564. In operation, the core portions 506a, b define optical receipt/transmission paths for the memories 500 while the electrical substrate 562 can provide power to the memories 500. In this manner, the optical layer 564 can reduce the need for discrete optical fibers (e.g., the optical fibers 406a, b shown in FIG. 4) in the memory device 550. In some embodiments, short optical fibers can be used to optically couple the memories 500 and/or optical connectors 558 to the core portions 506a, b of the optical layer 564. In other embodiments, the memories 500 and/or optical connectors 558 can be directly optically coupled to the optical layer 564 via vertical grating couplings that can be formed in the optical layer 564, or via other suitable structures or components. In some embodiments, optically transparent epoxies and/or index-matching gels can be used to close gaps (e.g., optically couple discrete components) between the optical layer 564, the memories 500, and/or the optical connectors 558. In other embodiments, the optical connectors 558 can be omitted and/or the optical layer 564 can be extended to provide an optical coupling to external devices. For example, the optical layer 564 can comprise a polymer waveguide having a longer length than the electrical substrate 562 such that the waveguide extends past the electrical substrate 562 to enable the waveguide to be routed to and directly coupled to another memory device or external device.

In some embodiments, data transmission to/from the memories 500 is carried out only over the optical layer 564—and not over the electrical substrate 562. Put differently, in some embodiments, the electrical substrate 562 only electrically couples the memories 500 to power/ground.

Figure 6:
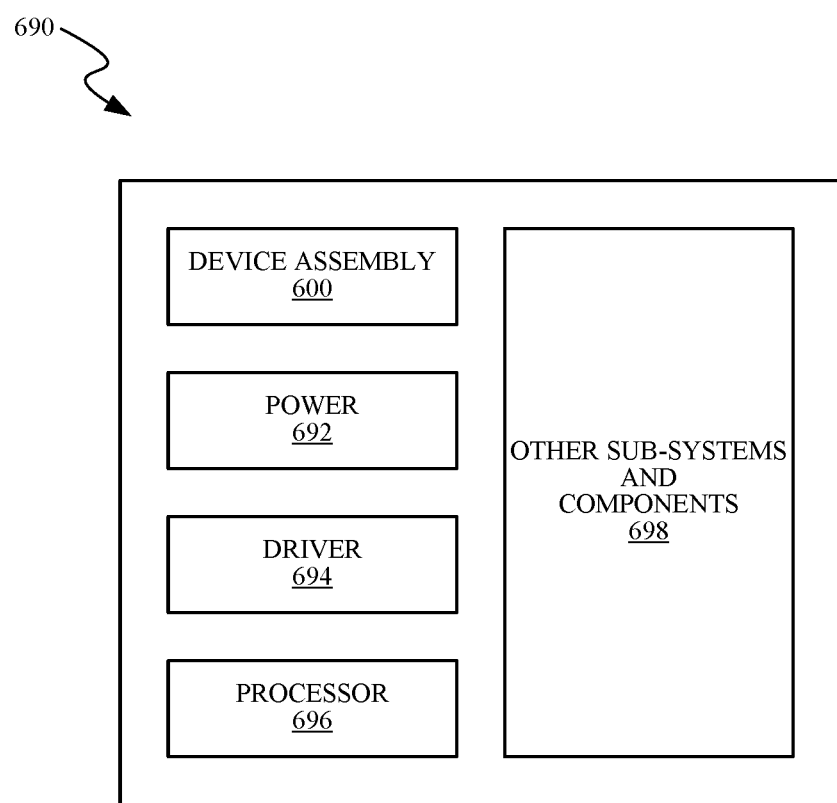
FIG. 6 is a schematic view of a system that includes a semiconductor package and/or memory device configured in accordance with embodiments of the present technology.

FIG. 6 is a schematic view a system that includes a semiconductor package and/or memory device configured in accordance with embodiments of the present technology. Any one of the foregoing semiconductor packages and/or memory devices described above with reference to FIGS. 1-5 can be incorporated into any of a myriad of larger and/or more complex systems, a representative example of which is system 690 shown schematically in FIG. 6. The system 690 can include a memory device assembly 600, a power source 692, a driver 694, a processor 696, and/or other subsystems and components 698. The memory device assembly 600 can include features generally similar to those of the memory devices and semiconductor packages described above with reference to FIGS. 1-5. The resulting system 690 can perform any of a wide variety of functions, such as memory storage, data processing, and/or other suitable functions. Accordingly, representative systems 690 can include, without limitation, hand-held devices (e.g., mobile phones, tablets, digital readers, and digital audio players), computers (e.g., workstations, servers, etc.), vehicles, appliances, and other products. Components of the system 690 may be housed in a single unit or distributed over multiple, interconnected units (e.g., through a communications network). The components of the system 690 can also include remote devices and any of a wide variety of computer readable media.

From the foregoing, it will be appreciated that specific embodiments of the technology have been described herein for purposes of illustration, but that various modifications may be made without deviating from the disclosure. Accordingly, the invention is not limited except as by the appended claims. Furthermore, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

I claim:

1. A semiconductor package, comprising:
a substrate having an upper surface;
a semiconductor die having an upper surface and a lower surface, wherein the semiconductor die is coupled to the upper surface of the substrate via a first die-attach material extending between the lower surface of the semiconductor die and the upper surface of the substrate, wherein the semiconductor die includes bond pads at the upper surface of the semiconductor die, and wherein the semiconductor die includes analog driver circuitry;
a first photon integrated circuit (PIC) chip having an upper surface and a lower surface, wherein the first PIC chip is coupled to the upper surface of the substrate via a second die-attach material extending between the lower surface of the first PIC chip and the upper surface of the substrate, wherein the first PIC chip includes bond pads at the upper surface of the first PIC chip, and wherein the first PIC chip is electrically coupled to the semiconductor die via first wirebonds extending between the bond pads of the first PIC chip and corresponding ones of the bond pads of the semiconductor die;
a first optical fiber optically coupled to the first PIC chip, wherein the first PIC chip is configured to:
receive first optical signals over the first optical fiber;
convert the first optical signals into electrical signals; and
transmit the electrical signals over the first wirebonds to the semiconductor die;
a second PIC chip having an upper surface and a lower surface, wherein the second PIC chip is coupled to the upper surface of the substrate via a third die-attach material extending between the lower surface of the second PIC chip and the upper surface of the substrate, wherein the second PIC chip includes bond pads at the upper surface of the second PIC chip and a light source, and wherein the second PIC chip is electrically coupled to the semiconductor die via second wirebonds extending between the bond pads of the second PIC chip and corresponding ones of the bond pads of the semiconductor die; and
a second optical fiber optically coupled to the second PIC chip;
wherein the analog driver circuitry is configured to drive the light source to modulate second optical signals generated by the light source for transmission on the second optical fiber.

2. The semiconductor package of claim 1 wherein the second PIC chip includes a multiplexer configured to multiplex the modulated second optical signals for transmission on the second optical fiber.

3. The semiconductor package of claim 1 wherein the light source is integrally formed with the second PIC chip.

4. The semiconductor package of claim 1 wherein the first optical signals are multiplexed optical signals, and wherein the first PIC chip includes a demultiplexer configured to demultiplex the multiplexed optical signals.

\* \* \* \* \*